(12) United States Patent
Chua et al.

(10) Patent No.: US 8,513,643 B2
(45) Date of Patent: Aug. 20, 2013

(54) MIXED ALLOY DEFECT REDIRECTION REGION AND DEVICES INCLUDING SAME

(75) Inventors: Christopher L. Chua, San Jose, CA (US); Zhihong Yang, Sunnyvale, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 203 days.

(21) Appl. No.: 13/096,457

(22) Filed: Apr. 28, 2011

(65) Prior Publication Data
US 2011/0303891 A1 Dec. 15, 2011

Related U.S. Application Data

(63) Continuation-in-part of application No. 11/470,569, filed on Sep. 6, 2006, now abandoned.

(51) Int. Cl.
*H01L 33/04* (2010.01)

(52) U.S. Cl.
USPC .............. 257/13; 257/14; 257/15; 257/189; 257/E33.008

(58) Field of Classification Search
USPC .................. 257/13, 14, 15, 189, E33.008
See application file for complete search history.

(56) References Cited

U.S. PATENT DOCUMENTS

| | | | |
|---|---|---|---|
| 4,927,471 A | 5/1990 | Okuda | |
| 5,578,839 A | 11/1996 | Nakamura et al. | |
| 6,069,367 A | 5/2000 | Tomiya et al. | |
| 6,078,064 A | 6/2000 | Ming-Jiunn et al. | |
| 6,107,644 A | 8/2000 | Shakuda et al. | |
| 6,365,429 B1 | 4/2002 | Kneissl et al. | |
| 6,455,340 B1 | 9/2002 | Chua et al. | |
| 6,456,640 B1 | 9/2002 | Okumura | |
| 6,617,060 B2 | 9/2003 | Weeks | |
| 6,617,261 B2 | 9/2003 | Wong et al. | |
| 6,744,800 B1 | 6/2004 | Kneissl et al. | |
| 6,757,314 B2 | 6/2004 | Kneissl et al. | |
| 6,864,502 B2 | 3/2005 | Shibata et al. | |
| 6,865,202 B2 | 3/2005 | Matsumoto | |
| 6,874,629 B1 | 4/2005 | Senda et al. | |

(Continued)

FOREIGN PATENT DOCUMENTS

| EP | 0331433 A1 | 9/1989 |
|---|---|---|
| EP | 07116583 | 3/2009 |

OTHER PUBLICATIONS

Han et al., "Control and elimination of cracking of AlGaN using low-temperature AlGaN interlayers", Appl. Phys. Lett, vol. 78, 67 (2001).

(Continued)

*Primary Examiner* — Long Pham
(74) *Attorney, Agent, or Firm* — Jonathan A. Small

(57) ABSTRACT

An optical semiconductor device such as a light emitting diode is formed on a transparent substrate having formed thereon a template layer, such as AlN, which is transparent to the wavelength of emission of the optical device. A mixed alloy defect redirection region is provided over the template layer such that the composition of the defect redirection region approaches or matches the composition of the regions contiguous thereto. For example, the Al content of the defect redirection region may be tailored to provide a stepped or gradual Aluminum content from template to active layer. Strain-induced cracking and defect density are reduced or eliminated.

19 Claims, 13 Drawing Sheets

(56) References Cited

U.S. PATENT DOCUMENTS

| | | | |
|---|---|---|---|
| 6,875,627 B2 | 4/2005 | Bour et al. | |
| 6,881,601 B2 | 4/2005 | Sugawara | |
| 6,898,226 B2 | 5/2005 | Otoma et al. | |
| 6,949,140 B2 | 9/2005 | Sarayama et al. | |
| 7,042,019 B1 | 5/2006 | Wu et al. | |
| 7,115,896 B2 | 10/2006 | Guo et al. | |
| 7,326,963 B2 * | 2/2008 | Gaska et al. | 257/79 |
| 7,339,205 B2 | 3/2008 | Piner et al. | |
| 2006/0118820 A1 | 6/2006 | Gaska et al. | |

OTHER PUBLICATIONS

Nakamura et al., "InGaN/GaN/AlGaN-Based Laser Diodes with Modulation-Doped Strained-Layer Superlattices", J. J. Appl. Phys., vol. 36, 1568 (1997).

Chen et al., "AlGaN layers grown on GaN using strain-relief interlayers", Appl. Phys. Lett., vol. 81, 4961 (2002).

Vaudo et al., GaN Boule Growth: A Pathway to GaN Wafers With Improved Material Quality, Physica Status Solidi A, v 194, n 2, Dec. 2002, p. 494-7, ISSN: 0031-8965, CODEN: PSSABA.

Ren et al., "Growth, Charactreization, and Application of High Al-content AlGaN and High Power III-Nitride Ultraviolet Emitters", Mater. Res. Soc. Symp. Proc. vol. 831, E1.4.1 (2005).

Feltin et al., "Stress control in GaN grown on silicon (111) by metalorganic vapor phase epitaxy", Appl. Phys. Lett., vol. 79, No. 20, pp. 3230 et seq. (Nov. 2001).

Adivarahan et al., "250 nm AlGaN light-emitting diodes", Appl. Phys. Lett., vol. 85, No. 12, pp. 2175 et seq. (Sep. 2004).

* cited by examiner

MIXED ALLOY DEFECT REDIRECTION REGION AND DEVICES INCLUDING SAME

CROSS-REFERENCE TO RELATED APPLICATIONS

The present application is a continuation-in-part of copending U.S. Application for Letters Patent titled "Variable Period Variable Composition Superlattice And Devices Including Same", Ser. No. 11/470,569, filed on Sep. 6, 2006, which is incorporated by reference herein in its entirety, and to which priority is hereby claimed.

STATEMENT REGARDING FEDERALLY SPONSORED RESEARCH AND DEVELOPMENT

The U.S. Government has a fully paid-up license in this disclosure and the right in limited circumstances to require the patent owner(s) to license others on reasonable terms as provided for by the terms of contract number N66001-02-C-8017 awarded by the Defense Advanced Research Projects Agency, and contract number DAAH01-03-9-R003 sponsored by the U.S. Army Aviation and Missile Command.

BACKGROUND

The present disclosure is related generally to the field of semiconductor light emitting devices, and more specifically to an architecture for an improved high-Al content, low defect quantum well light emitting device formed directly on a final substrate.

In the III-V compound semiconductor family, the nitrides have been used to fabricate visible wavelength light emitting device active regions. They also exhibit a sufficiently high bandgap to produce devices capable of emitting light in the ultraviolet, for example at wavelengths between 290 and 400 nanometers. In particular, InAlGaN systems have been developed and implemented in visible and UV spectrum light emitting diodes (LEDs), such as disclosed in U.S. Pat. No. 6,875,627 to Bour et al., which is incorporated herein by reference. These devices are typically formed on an $Al_2O_3$ (sapphire) substrate, and comprise thereover a GaN:Si or AlGaN template layer, an AlGaN:Si/GaN superlattice structure for reducing optical leakage, an n-type electrode contact layer, a GaN n-type waveguide, an InGaN quantum well heterostructure active region, and a GaN p-type waveguide region. In addition, the complete device may also have deposited thereover a p-type AlGaN:Mg cladding layer and a capping layer below a p-type electrode.

While significant improvements have been made in device reliability, optical power output, and mode stability, the performance of the nitride-based lasers and light emitting diodes emitting in the ultraviolet (UV) is still inferior to that of their blue or violet counterparts. It is particularly true that for deep UV lasers and light emitting diodes operating at wavelengths below 340 nm, the nature of the substrate and template layer have a critical impact on the overall device performance. For example, differences in lattice constant between the substrate and the structural layers of the device significantly affects optical output and device lifetime. While $Al_2O_3$ (sapphire) as a substrate has numerous advantages, it is highly lattice mismatched to the structural layers of typical deep UV epi-layers. The prior art AlGaN template layer formed over the typical $Al_2O_3$ substrate mitigates the problem somewhat, but the resulting crystal quality of the high aluminum-containing structural layers in typical deep UV light-emitting devices utilizing these templates are still very poor.

The dislocation densities in AlGaN or AlN template layers on sapphire are typically in the mid $10^9$ to high $10^{10}$ cm$^{-2}$ range. As a consequence, the external quantum efficiencies of deep UV light emitting diodes in the 290 nm to 340 nm range are still well below the external quantum efficiencies for blue GaN-based LED structures. The high dislocation densities also reduce the operating lifetime of devices utilizing such template layers.

Efforts to improve the quality of the LED structure in the ultraviolet range on $Al_xGa_{1-x}N$/sapphire templates have presented significant challenges due to the high defect density of epitaxial layers formed over the AlGaN crystallographic template. These defects tend to propagate upward, perpendicular to the layer planes, in the direction of crystal growth, forming features known as threading dislocation defects (or simply threading dislocations). If not mitigated, threading dislocations can permeate throughout the structure and reach the active layer, where the transmitted defects compromise light emission efficiency through non-radiative recombination.

In many cases, mechanical stresses lead to cracks in the heterostructure formed thereon. These issues are exacerbated when the Al content of layers formed above the AlGaN/sapphire system increases. Yet, as previously mentioned, an increased Al content (e.g., up to ~50% in the MQWH active region of a 280 nm light emitting diode, and 60% to 70% in the surrounding AlGaN current and optical confinement layers) is required to obtain devices which emit in the mid- to deep-UV.

Various groups have published approaches to dealing with these shortcomings. All references referred to herein, and specifically each of the following references, are incorporated herein by reference. For example, Han et al., Appl. Phys. Lett, Vol 78, 67 (2001), discuss the use of a single AlN interlayer formed at low temperatures to avoid strain development. This low-temperature AlN interlayer approach has proven unsuccessful in the case of heterostructure growth with high Al mole fractions. Nakamura et al., J. J. Appl. Phys., vol. 36, 1568 (1997) has suggested short period GaN/AlGaN superlattice layers as a way of extending the critical layer thickness of AlGaN films grown pseudomorphically on GaN/sapphire. But the average Al mole fraction in these AlGaN/GaN systems is at such a low level (~10% or less) that it is not compatible with deep UV light emitting diodes. Chen et al., Appl. Phys. Lett., vol. 81, 4961 (2002) suggests an AlGaN/AlN layer as a dislocation filter for an AlGaN film on a AlGaN/sapphire template. But again, the AlGaN/sapphire template presents the aforementioned series resistance problem. And Wong et al. in U.S. patent application Ser. No. 11/356,769, filed on Feb. 17, 2006, proposes a GaN/AlN superlattice formed between the GaN template layer and the MQWH active region. But again, the GaN template layer must be removed prior to light output for such a device.

There is a need for a UV light emitting device with improved operation characteristics. Accordingly, there is a need for a method and structure facilitating a high Al content MQWH active region with reduced threading dislocations, cracking, and related damage.

SUMMARY

The present disclosure is directed to facilitating the growth of high aluminum content heterostructure active regions on an initial AlGaN surface for UV light emitting devices such as light emitting diodes (LED) and laser diodes (LD). A defect redirection layer is described, which is grown between the active layer and the substrate to redirect or "bend" threading dislocations so that the dislocations propagate at an angle other than perpendicular to the direction of crystal growth. The net effect is a reduced threading dislocation density at the active region where light is emitted.

The initial AlGaN surface can, for example be an AlN or a GaN template on sapphire, an AlGaN template on silicon carbide, or a bulk AlN or GaN substrate. More specifically, the present disclosure is directed to systems and methods for providing an improved transition from an initial $Al_xGa_{1-x}N$ surface (where $0 \leq x \leq 1$) to a high-Al content MQWH active region. According to one embodiment of the present disclosure, a structure is formed beginning with a sapphire substrate on which is deposited an AlN template layer. A defect redirection region is next formed over the template layer such that the average Al content of the strain region varies over its thickness. For example, the average Al content may go from a relatively high value, such as 80% or higher, adjacent the template layer to a relatively lower value, such as 60% or lower, adjacent the MQWH region. In this way, the average Al content of the defect redirection region more closely matches the Al content of the regions contiguous thereto.

According to one aspect of the disclosure, the defect redirection region is comprised of a mixed alloy region. The mixed alloy region may be comprised of two or more subsections of alternating layers comprising a great percentage of AlN (an "AlN layer") of a first thickness and a greater percentage of GaN (a "GaN layer") of a second thickness. The thickness of the AlN layer decreases from subsection to subsection along the height of the defect redirection region. The effect of this varying thickness of AlN is to vary the average Al content of that subsection. In this way, the average Al content may be decreased from one subsection to the next until an uppermost layer has the desired Al content. In one embodiment, the defect redirection region comprises two such subsections. In another embodiment of the present disclosure the defect redirection region comprises more than two subsections.

According to another aspect of the disclosure, the mixed alloy region may be comprised of a continuum of alternating layers of a higher percentage of AlN (again, an "AlN layer") and a high percentage of GaN (and again, a "GaN layer"). The thicknesses of the AlN layers gradually decrease from one AlN/GaN pair to the next. In this way, the average Al content of the defect redirection region decreases from bottom to top, such that the bottom portion thereof matches (or approaches) the Al content of a layer contiguous thereto (e.g., the template layer), and the average Al content of the top portion matches (or approaches) the Al content of a layer contiguous thereto (e.g., the MQWH) so that an improved lattice match is provided at the region interfaces.

According to still another aspect of the disclosure, a pure AlN layer is deposited over the AlN template layer prior to deposition of the defect redirection region. This AlN interface layer is generally thicker than the AlN layers of the defect redirection region, and provides a transition from the template layer to the defect redirection region.

Thus, in one embodiment, the present disclosure provides a defect redirection region for a light emitting semiconductor device, said defect redirection region formed above a substrate and below a multiple quantum well heterostructure active region, the multiple quantum well heterostructure active region composed in part of a first element so as to have an average composition of the first element, said defect redirection region comprising a plurality of groups of at least two layers, at least one layer of each said group comprised at least in part of the first element such that each group has an average concentration of the first element, the average concentration of the first element varying from group to group from a first concentration to a second concentration along the height of the defect redirection region such that the average concentration of the first element in the group nearest the multiple quantum well heterostructure active region approaches the concentration of the first element in said multiple quantum well heterostructure active region. A number of variation of this embodiment are also provided.

In another embodiment, the present disclosure provides a defect redirection region for a light emitting semiconductor device, said defect redirection region formed above a first semiconductor layer and below a second semiconductor layer, the bandgap of the first semiconductor layer being different from the bandgap of the second semiconductor layer, said defect redirection region comprising a plurality of groups of layers, each group comprising a periodic ordering of layers, the average bandgap of the group closest to the first semiconductor layer being closer to the bandgap of the first semiconductor layer than to the bandgap of the second semiconductor layer. A number of variation of this embodiment are also provided.

Thus, the defect redirection region according to the present disclosure provides a transition between a starting surface (such as a substrate, possibly with a template layer formed thereon) and the MQWH. Strain-induced cracking and defect density are reduced or eliminated.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

Figure 1:
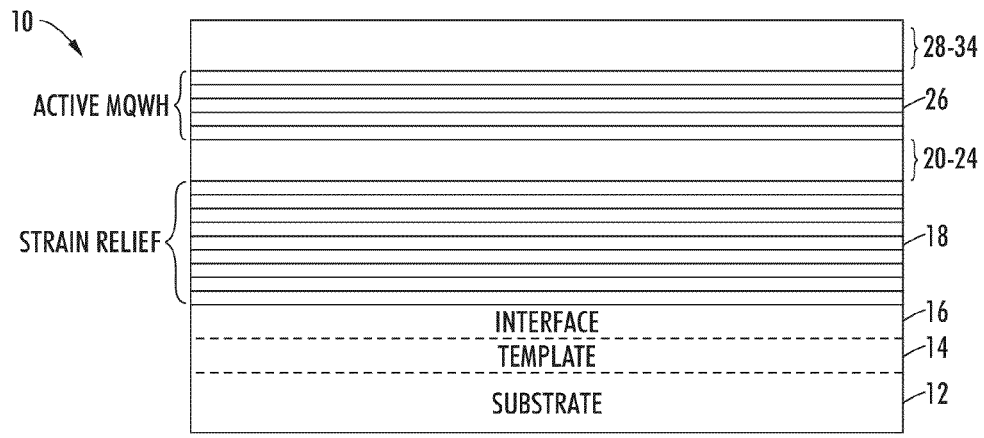
FIG. 1 is a cross-sectional illustration of the general architecture of a heterostructure AlGaInN light emitting device structure in accordance with the present disclosure.

With reference now to FIG. 1, there is shown therein the general architecture of a heterostructure AlGaInN light emitting device structure 10 in accordance with the present disclosure. Diode structure 10 comprises a substrate 12. According to one embodiment of the present disclosure, substrate 12 may be $Al_2O_3$ (sapphire) on which is formed a template layer 14. As described further below, other substrates such as Silicon Carbide, bulk AlN, or bulk GaN may be employed. Template layer 14 may be AlN, but may also be $Al_xGa_{1-x}N$ where x is not equal to 1. In some cases, template layer 14 is not necessary and is absent. Formed thereon is an optional interface layer 16. In the embodiment in which template layer 14 is AlN, interface layer 16, if present, is preferably also AlN.

Formed above interface layer 16 is mixed alloy defect redirection region 18 comprising a number of layer pairs, such as AlN/GaN, described further below. Additional layers, such as AlGaN:Si buffer layer 20, n-contact layer 21, AlGaN/AlGaN:Si mixed alloy n-strain layer 22 (which allows for increased cladding thickness and hence reduced optical leakage of subsequent layers), AlGaN:Si n-cladding (index guiding) layer 24, and active MQWH layer 26 (such as InAlGaN) may then be formed thereover.

Subsequent layer such as the following may also be formed on MQWH layer 26: an AlGaN:Mg p-cladding (index guiding) layer 28, an AlGaN:Mg buffer layer 30, an AlGaN/AlGaN:Mg p-strain layer 32, and a GaN:Mg capping layer 34. The aforementioned layers may be formed by any method know in the art, including but not limited to methods described in U.S. Pat. No. 6,875,627 to Bour et al., which is incorporated by reference herein. It will be appreciated that a complete device will also include electrodes, not shown, as well as other similar or alternative devices formed in the manner of an array in appropriate embodiments.

Prior art devices comprising a template layer may include a material such as GaN for the template which must be removed prior to device operation, or which result in significant layer cracking and/or high defect density. Other prior art devices that comprise a high Al-content layer grown directly on an AlN template layer will exhibit high strain due to lattice mismatch between the two adjacent materials. One aspect of the present disclosure addresses these problems through the introduction of a transition layer between an initial growth surface and a high Al containing active layer, the transition layer comprising of a novel mixed alloy defect redirection region.

Figure 2:
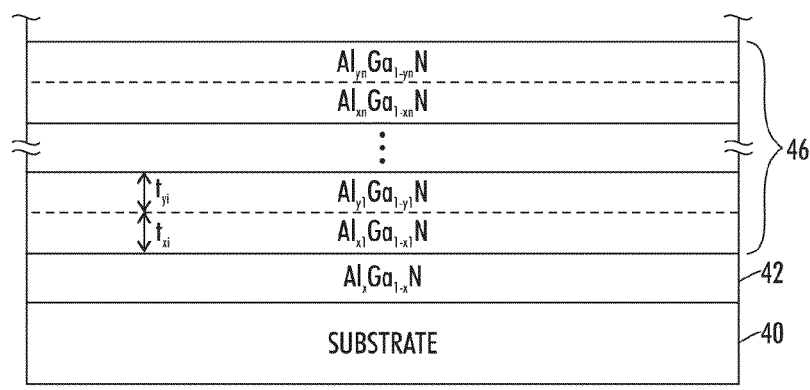
FIG. 2 is an illustration of the general architecture of a mixed alloy defect redirection region, and surrounding layers, according to one aspect of the present disclosure.

FIG. 2 is an illustration of the general architecture of mixed alloy defect redirection region, and surrounding layers, according to one aspect of the present disclosure. In one embodiment, a layer 42, typically $Al_xGa_{1-x}N$ ($0 \leq x \leq 1$), is formed on substrate 40. While layer 42 is often referred to as a template layer, the combination of substrate 40 and layer 42 together form the template for the growth of additional layers. Over this template a mixed alloy defect redirection region 46 is formed which acts as a transition from the template to the MQWH active region, gradually or in step-wise fashion transitioning from the aluminum content of the template to the aluminum content of the active region.

As shown in FIG. 2, defect redirection region 46 consists of a plurality of pairs of layers of the form $Al_{xi}Ga_{1-xi}N$, with a thickness $t_{xi}$, and $Al_{yi}Ga_{1-yi}N$, with a thickness $t_{yi}$, where $0 < x \leq 1$ and $0 < y \leq 1$. The plurality of layers are arranged in i groups where $2 \leq i \leq n$. Thus, xi represents the aluminum content in a first layer of a layer pair of the $i^{th}$ group, and yi represents the aluminum content in a second layer of that layer pair in the $i^{th}$ group. The average aluminum content of each group, i, of layer 46 can be determined as follows:

$$\frac{t_{xi}x_i + t_{yi}y_i}{t_{xi} + t_{yi}}$$

Accordingly, by varying xi, yi, $t_{xi}$ and $t_{yi}$, the average aluminum content of each group of layer pairs can be controlled. Variable periodicity is achieved by varying the thickness $t_{xi}$ and $t_{yi}$ for different periods i, while variable composition is achieved by varying the compositions xi and yi for different periods i.

Figure 3:
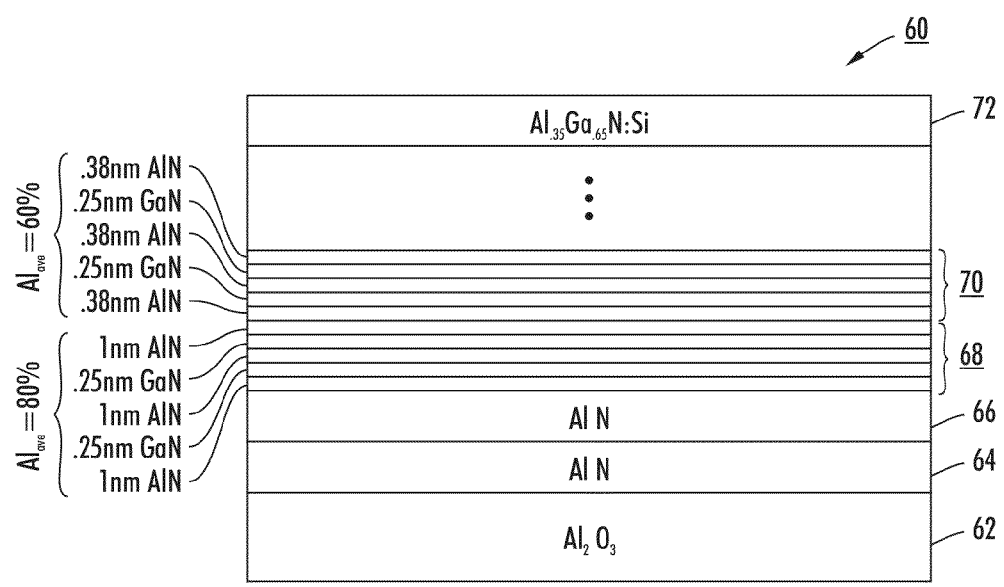
FIG. 3 is a cross-sectional illustration of an exemplary light emitting diode structure in accordance with the present disclosure.

With reference now to FIG. 3, in order to demonstrate the concept forming the present disclosure, we grew a light emitting diode (LED) structure 60 utilizing a two-group mixed alloy defect redirection region. We chose an AlN/GaN mixed alloy design with fixed composition (xi≅1 and yi≅0) for all periods. The LED is designed to operate at a wavelength λ of about 325 nm, requiring an active region heterostructure Al composition of about 35%. The template layer 64 was a 1 μm thick epitaxial layer of primarily AlN grown on a sapphire substrate 62 (in other words, with reference to FIG. 2, x≅1 in layer 42). A 25-30 nm thick AlN interface layer 66 was formed over template layer 64.

Figure 4:
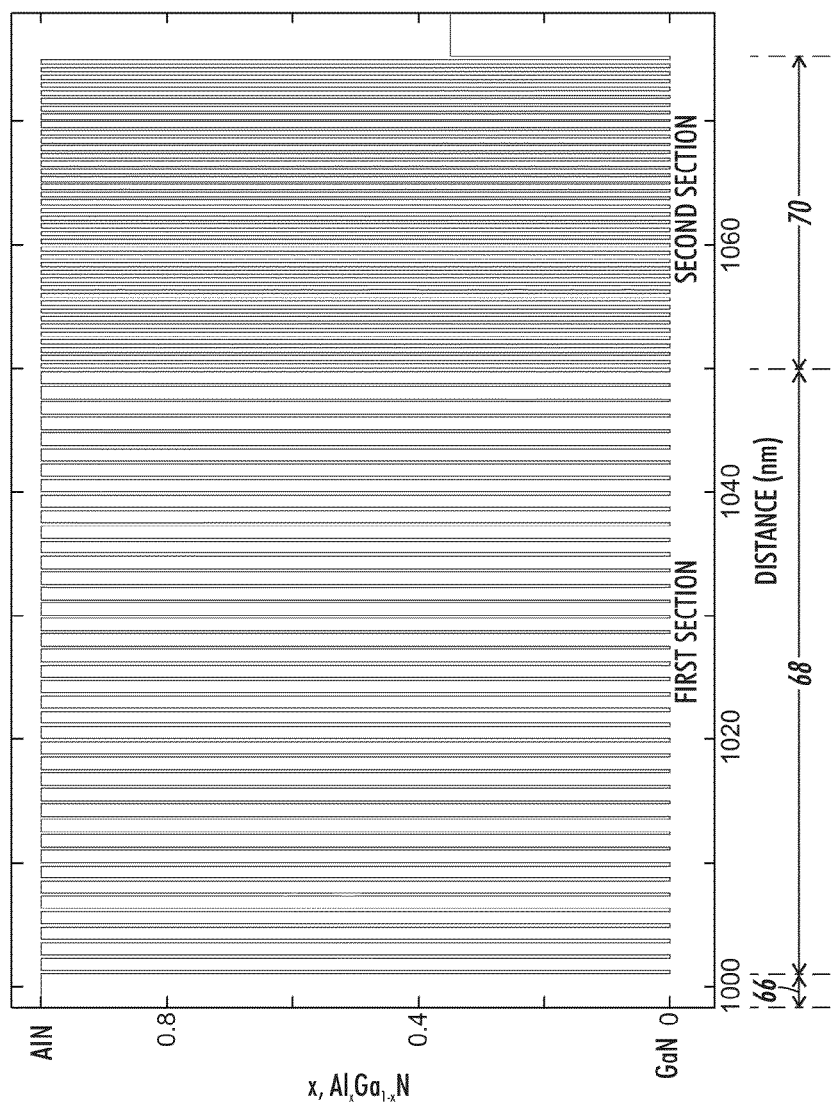
FIG. 4 is a graphical depiction of a variable period variable composition defect redirection region comprising two short-period groups of AlN/GaN layer pairs, illustrating the two respective periods of said groups.

A first group 68 of 40 layer pairs of AlN/GaN were then formed over layer 64. We chose a first region average Al composition of 80%, and a second region average Al content of 60%, and tailored the layer thicknesses for xi≅1 and yi≅0 to produce these compositions as follows. In the first group 68 the thicknesses were $t_{xi}$=1 nm, $t_{yi}$=0.25 nm for 40 pairs (i=1 to 40). In the second group 70 the thicknesses were $t_{xi}$=0.38 nm, $t_{yi}$=0.25 nm for the remaining 40 pairs (i=41 to 80). This produced an AlN/GaN mixed alloy region with an average Al composition of 80% for the first 40 pairs at the template end of the mixed alloy region and 60% for the second 40 pairs at the heterostructure end. The thicknesses of the individual layers of the mixed alloy region, $t_{xi}$ and $t_{yi}$, are made very thin to minimize strain due to lattice mismatch. FIG. 4 is a graphical depiction of groups 68, 70 of the aforementioned LED 60, illustrating the two respective periods of said groups. As will be appreciated from FIG. 4, while the number of layer pairs in each group is the same, the difference in layer thickness results in group 68 being thicker than group 70.

Figure 5:
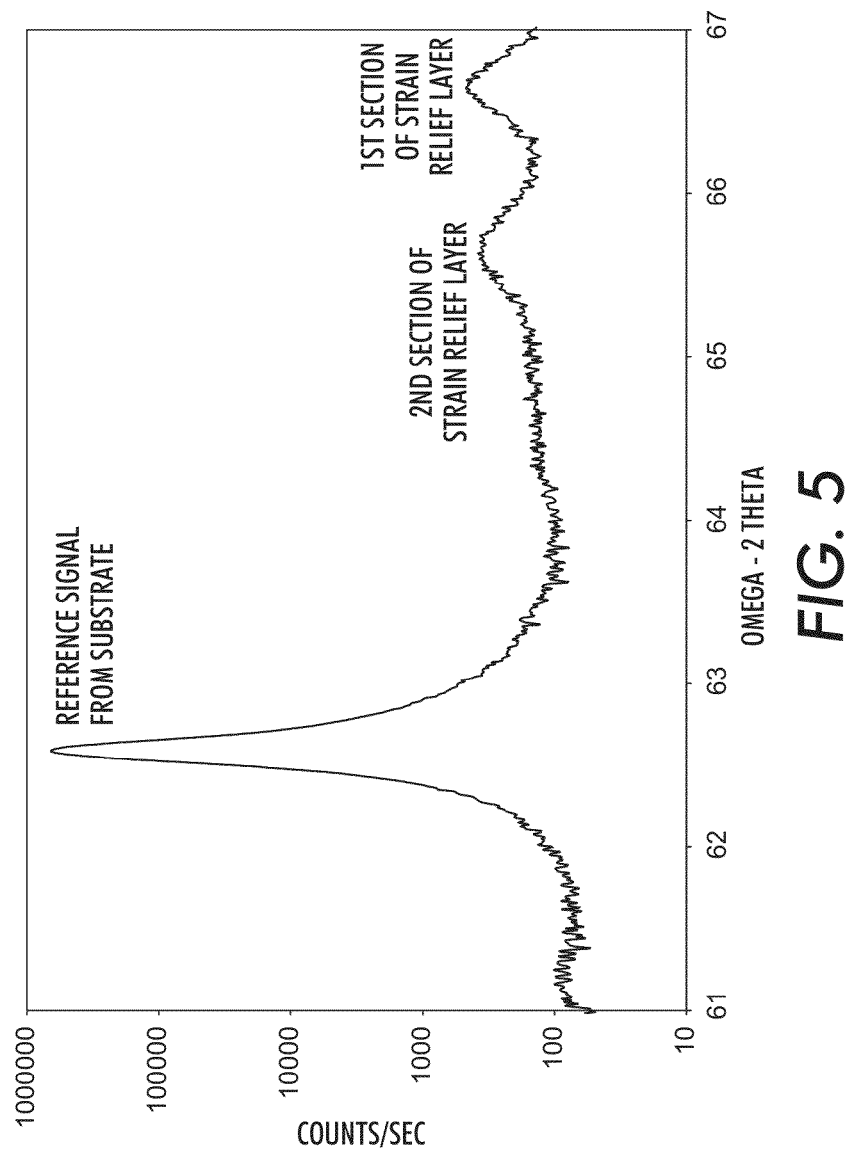
FIG. 5 is an x-ray spectrum of a mixed alloy region grown on a reference GaN sample.

Referring next to FIG. 5, the graph shows an x-ray spectrum taken from a sample comprising the mixed alloy region of FIG. 3 grown on a GaN on sapphire template. The GaN template produces a large main peak that is used as reference. The two side peaks come from regions 68 and 70 of FIG. 3. Region 70 of FIG. 3 has a lower average Al content than region 68, so it corresponds to the peak near the GaN reference peak. The X-ray peak occurring at the higher omega-2 theta angle comes from region 68. The two peaks correspond to the two different average Al contents within the two sections of the mixed alloy region. Mixed alloy regions with more than two different periods will have more than two X-ray peaks. Similar test samples comprising single period redirection regions such as those employed in the aforementioned U.S. patent application Ser. No. 11/356,769 will produce one peak.

Figure 6:
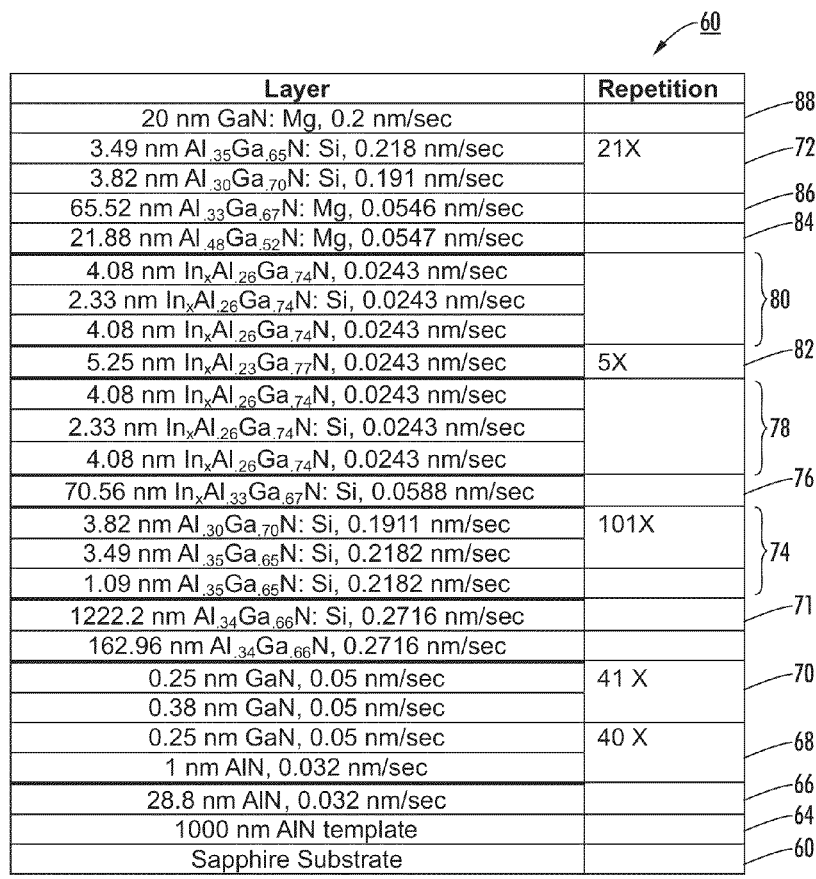
FIG. 6 is cross sectional view of a complete LED structure fabricated according to the present disclosure.

With reference to FIG. 6, a complete LED structure 60 according to the present disclosure is illustrated in cross section. In addition to the previously described elements, the structure incorporates n contact layer 71, n-cladding layer 74, n waveguide 76, barrier layers 78 (10.49 nm), 80 (89.19 nm), with quantum well 82 (5.25 nm) therebetween, tunnel barrier layer 84, and p waveguide and contact 86, 88. Some of these layers such as waveguide layers 76 and 84 allow the LED design to be easily extendable to laser diodes but do not perform actual waveguiding functions when the device is operated in LED mode.

Figure 7:
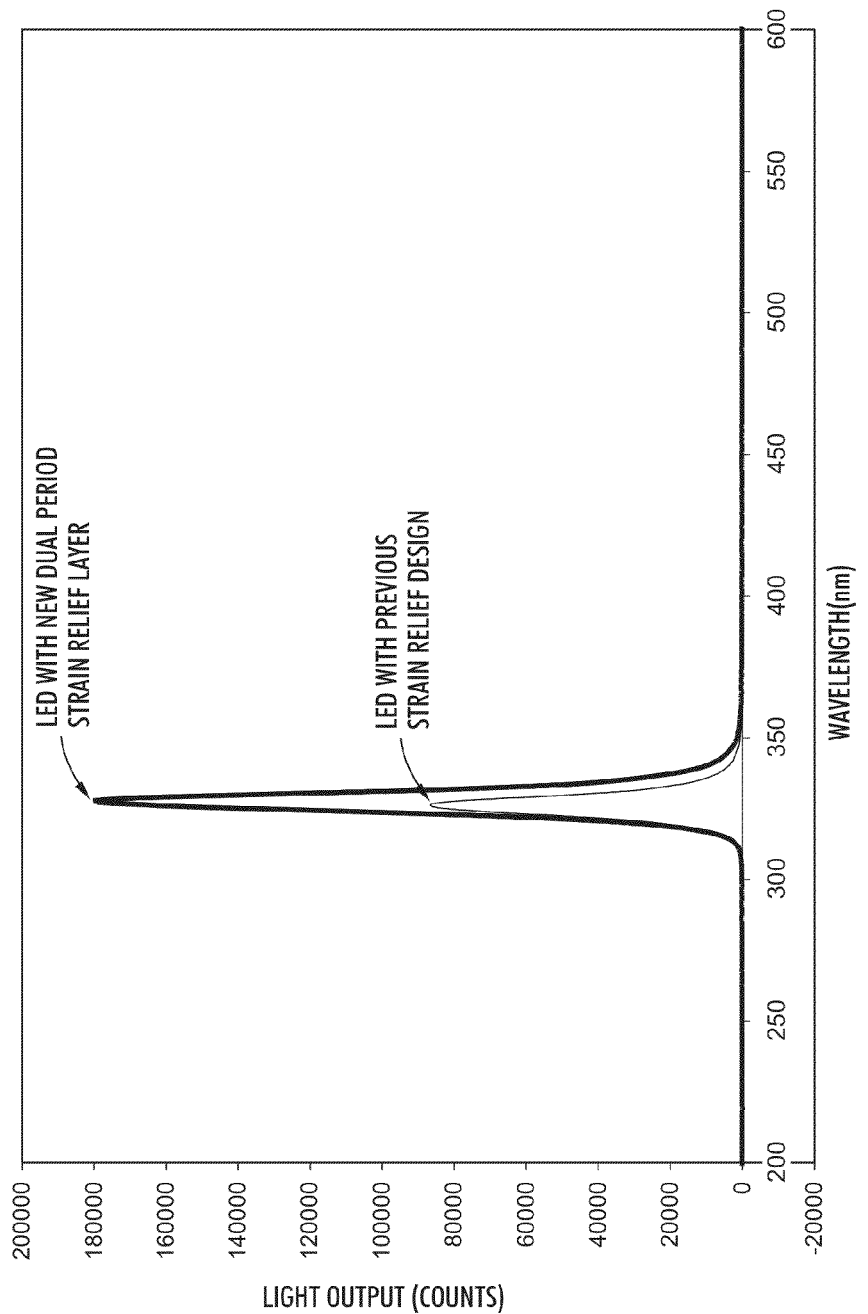
FIG. 7 is a comparison of the performance of an LED utilizing the mixed alloy defect redirection region according to the present disclosure to the performance of a prior art LED of identical structure with the exception of a GaN/AlN single-period superlattice strain relief region.

Referring now to FIG. 7, the performance of an LED utilizing the mixed alloy defect redirection region according to the present disclosure is compared to a prior art LED of identical structure with the exception of a GaN/AlN single-period superlattice strain relief region. As can be seen, the light output of the LED incorporating mixed alloy defect redirection region according to the present disclosure demonstrated significantly brighter optical output than the LED grown on prior art single period binary superlattice strain relief regions. From this we conclude that devices incorporating the mixed alloy defect redirection region taught herein benefit from enhanced optical output, due to the more gradual transition in Al content provided by the defect redirection structure.

Figure 8:
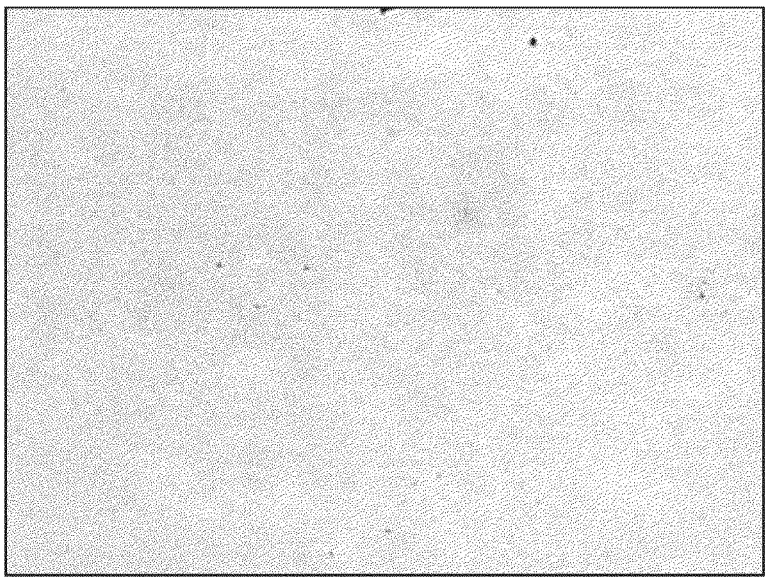
FIG. 8 is an optical micrograph of the top-most surface of an as-grown LED heterostructure manufactured according to the present disclosure.

FIG. 8 shows an optical micrograph of the top-most surface of an as-grown LED heterostructure manufactured with the variable period variable composition defect redirection region of the present disclosure. As can be seen, a substantially crack-free surface is produced.

Figure 9A:
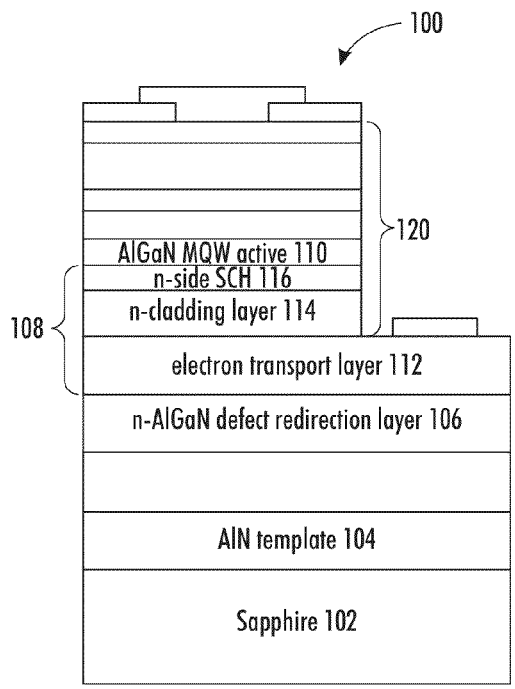
FIGS. 9A and 9B are cross-section representations and microphotographs, respectively, of an LED heterostructure manufactured according to the present disclosure.
Figure 9B:
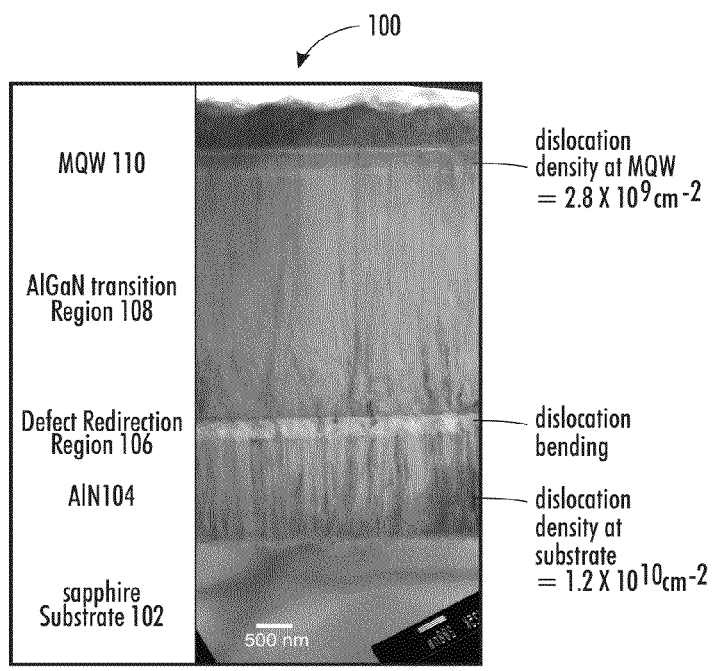

FIGS. 9A and 9B are cross-section representations and microphotographs, respectively, of an exemplary LED heterostructure 100 incorporating an AlN template layer 104 grown on a sapphire substrate 102, a defect redirection layer 106, a transition region 108, and a MQW active region 110 (among other layers). The defect redirection layer 106 bends threading dislocation out of the growth direction, and reduces defects at the active region 110. The transition region 108 can contain an electron transport layer 112, an n-cladding layer 114, and an n-side separate confinement heterostructure (SCH) 116. The n-cladding layer 114 frequently utilizes a superlattice to improve carrier transport and to reduce strain. The n-side SCH 116 is usually doped n-type in the case of LEDs, but is usually left undoped to lower optical losses in the case of lasers. In lateral injection devices, a mesa structure 120 is usually etched down to the electron transport layer to form n-contacts.

Figure 10:
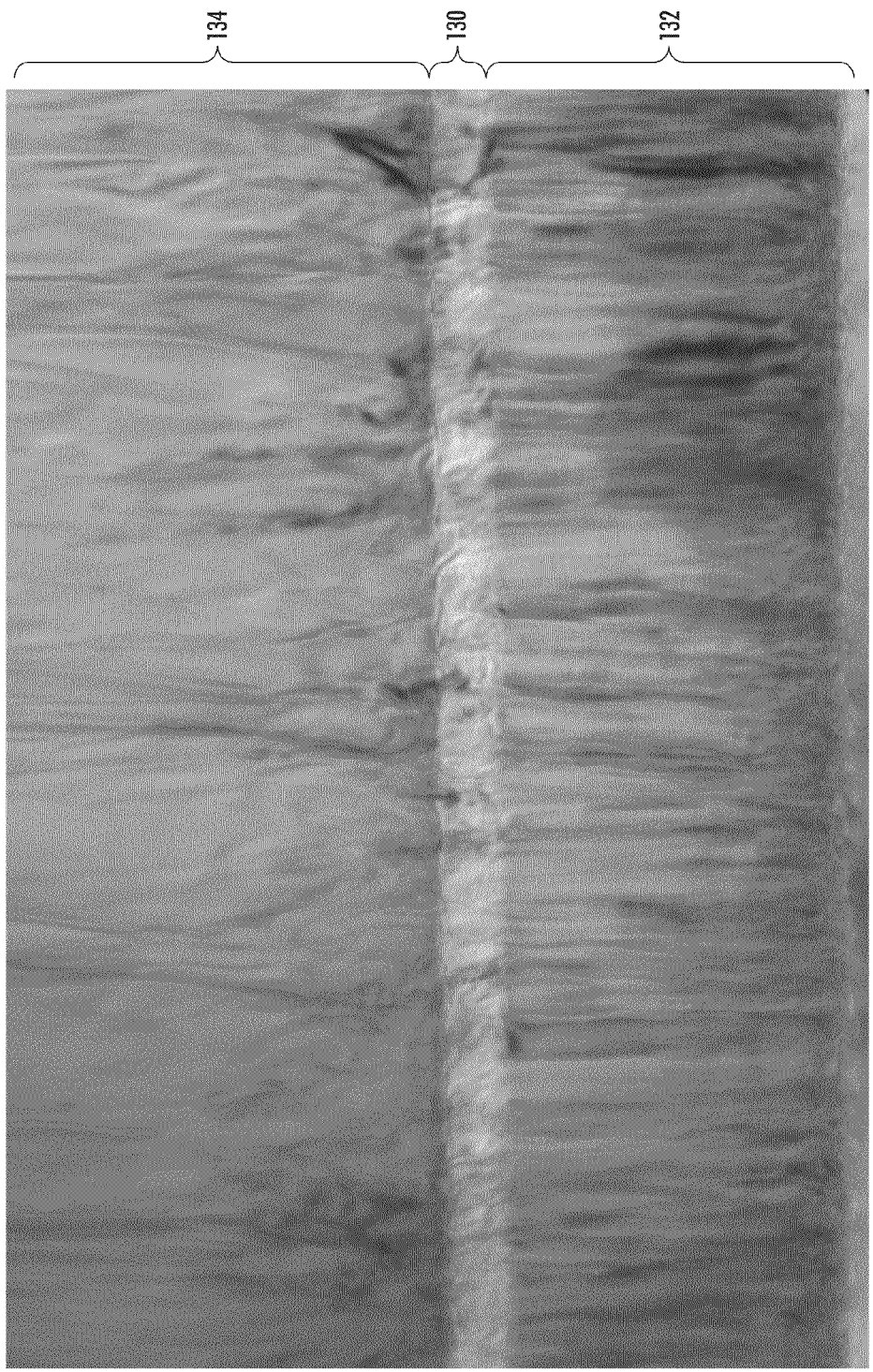
FIG. 10 is a cross-section microphotograph of a defect redirection region of an LED heterostructure manufactured according to the present disclosure.

FIG. 10 shows a magnified transmission electron micrograph (TEM) of a defect redirection layer 130 situated between a template layer 132 and a transition region 134. Template layer 132 has high threading dislocation density, illustrated by the many vertical shadow lines. Threading dislocations originating from the substrate and propagating through template layer 132 encounter a "discontinuity" in crystal structure upon reaching defect redirection layer 130. As is evident in the micrograph, this discontinuity bends the propagation direction of the threading dislocations away from the growth direction, as evidenced by the non-vertical shadow lines, so fewer threading dislocations reach transition region 134. Moreover, for those dislocations that enter transition region 134, a large fraction have bent (non-vertical) propagation directions. Consequently, even fewer threading dislocations reach the MQW active region (not shown). Transition region 130 is designed to be sufficiently thick such that a substantial portion of threading dislocations are bent out of the growth direction so that relatively few such defects reach the active region. Defect redirection layer 130 thus functions as a threading dislocation filter by creating a discontinuity in the crystal structure that bends the propagation direction of the defects. In one example, the defect density was reduced by a factor of 4.3, from $1.2 \times 10^{10}$ cm$^{-2}$ at the substrate to $2.8 \times 10^9$ cm$^{-2}$ at the active region.

Figure 11A:
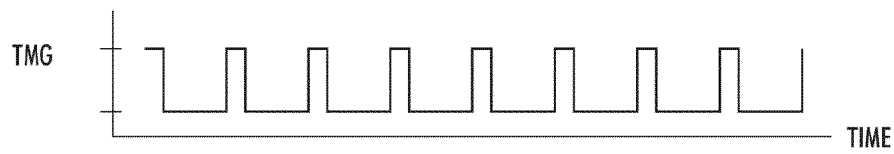
FIGS. 11A and 11B are illustrations of gas flow for compositional precursors.
Figure 11B:
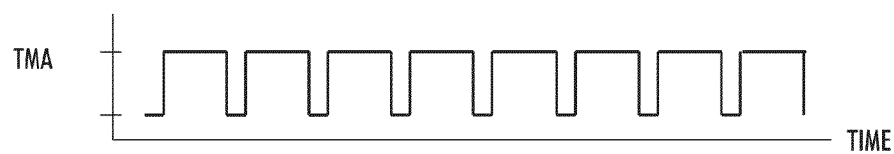
Figure 11C:
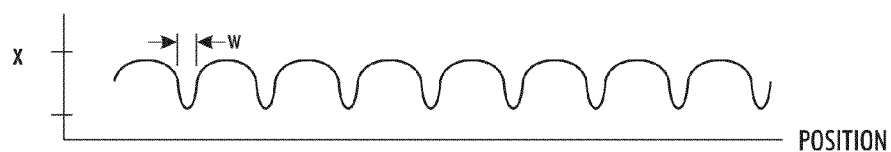
FIG. 11C is an illustration of the resulting alloy composition, respectively, for a method of forming a defect redirection layer comprising a periodic mixed alloy according to the present disclosure.

In one family of embodiments of the present disclosure, the defect reduction layer comprises of a periodic mixed alloy. With reference to FIGS. 11A through 11C, according to a first embodiment, the mixed alloy is formed by modulating TMA and TMG precursor gasses during growth. FIGS. 11A and 11B illustrate modulating the precursor gasses TMG and TMA, respectively, at 180° out of phase during epitaxial growth, but other modulation phase relationships are also possible. The resulting periodic mixed alloy AlGaN composition is shown in FIG. 11C. It is important that the width, w, of the gallium-rich region is designed to be sufficiently narrow in order to prevent crystal dislocation and/or film cracking. Typically, w<0.5 nm.

Figure 12A:
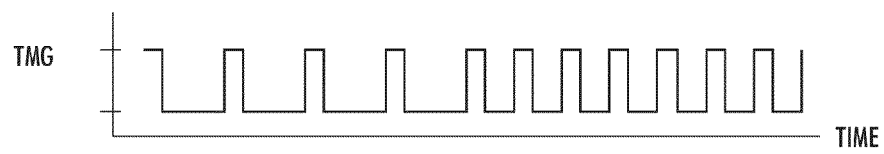
FIGS. 12A and 12B are illustrations of gas flow for compositional precursors.
Figure 12B:
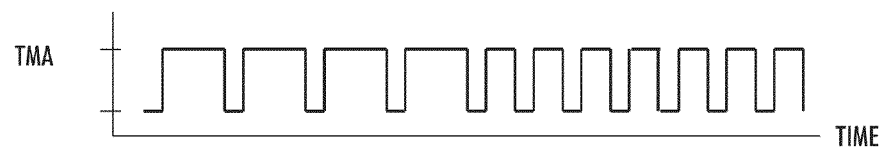
Figure 12C:
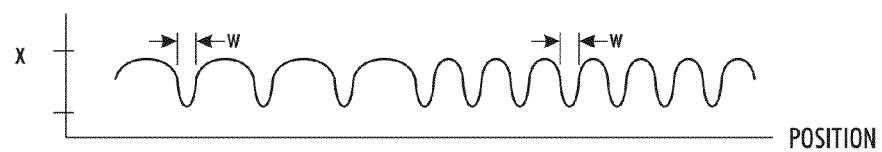
FIG. 12C is an illustration of the resulting alloy composition, respectively, for a method of forming a defect redirection layer comprising a variable-period periodic mixed alloy according to the present disclosure.

With reference to FIGS. 12A through 12C, according to a second embodiment of a defect reduction layer comprising a dual period periodic mixed alloy, the average aluminum composition within the defect reduction layer varies as a function of position. The change in average aluminum composition is accomplished by reducing the thickness of the high aluminum component of the periodic structure. The thickness, w, of the gallium-rich region is not changed. FIGS. 12A and 12B illustrate modulating the precursor gasses TMG and TMA, respectively, to obtain the structure illustrated in FIG. 12C. It is important that the thickness, w, is designed to be sufficiently narrow such that crystal dislocation and/or film cracking is prevented. Typically, w<0.5 nm. The concept of a dual period mixed alloy can be expanded to a general variable period structure.

Figure 13:
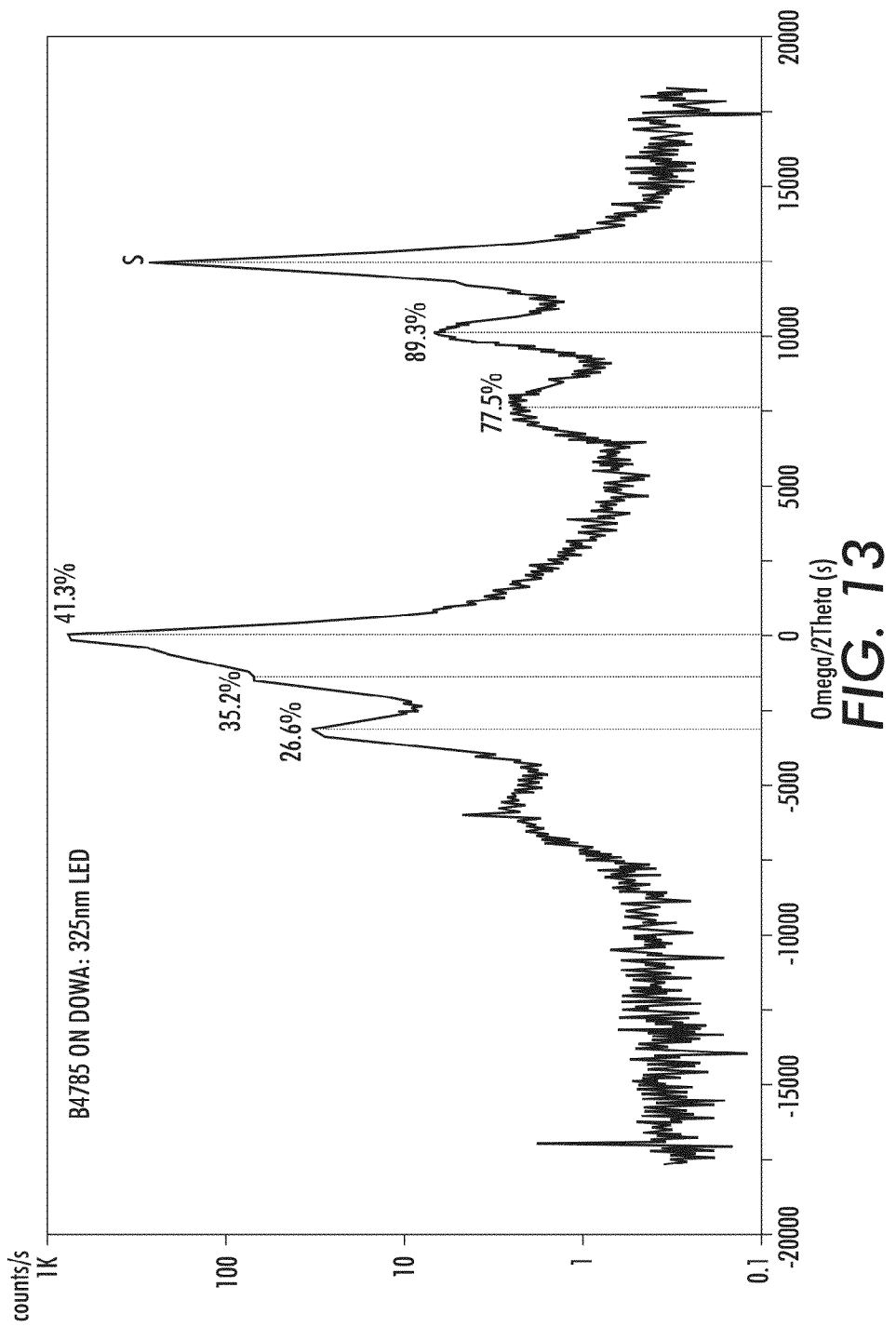
FIG. 13 is an x-ray diffraction graph for a dual-period periodic mixed alloy LED according to the present disclosure.

FIG. 13 shows the x-ray spectrum of a UV LED incorporating a dual period periodic mixed alloy defect reduction layer. The x-ray peaks indicate the average aluminum composition of the mixed alloy at each of the two periods. Unlike a superlattice, the mixed alloys do not produce satellite peaks in the x-ray spectrum.

Figure 14A:
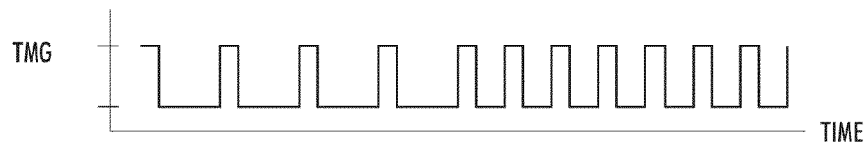
FIGS. 14A and 14B are illustrations of gas flow for compositional precursors.
Figure 14B:
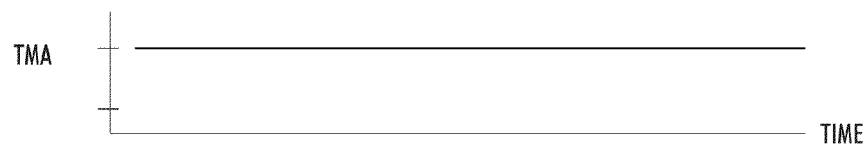
Figure 14C:
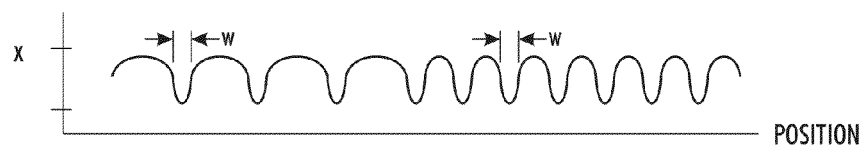
FIG. 14C is an illustration of the resulting alloy composition, respectively, for a method of forming a defect redirection layer comprising a pulse Ga method of forming a mixed alloy according to the present disclosure.

Finally, FIGS. 14A through 14C illustrate a third embodiment of a defect reduction layer formed by pulsing the TMG metal organic precursor. FIG. 14A illustrates modulating the precursor gasses TMG. In this embodiment, the precursor gas TMA is provided at a substantially steady state. The structure illustrated in FIG. 12C is thereby obtained.

It will be appreciated that while the foregoing describes an embodiment of the present disclosure utilizing a two-group, mixed alloy design, the concept extends to include many different region profiles, such as three or more groupings (e.g., with an average composition of approximately 80%, 70% and 60%, respectively), or continuously varying composition profiles, varying linearly, parabolically, exponentially or otherwise, each providing a different transition profile for the Al content in the region. For example, a three step mixed alloy region would have three layers per period, each layer with aluminum contents of, say, $x_i$, $y_i$, $z_i$ and thicknesses $tx_i$, $ty_i$, and $tz_i$ for period i. A three-group mixed alloy region would transition step-wise, with for example two steps per period, from the Al content matching or approaching that of the transition layer to the Al content matching or approaching that of the active region. The abrupt transition between layers within each period can also be replaced with a transition layer whose Al content varies continuously from a starting composition near that of the starting layer to an ending composition near that of the adjacent layer. The general case would be a defect redirection region comprising a continuously varying composition profile starting with a composition close to that of the initial surface and ending with an Al composition close to that of the heterostructure active layer. The continuous composition profile can be linear, parabolic, or can consist of curves with multiple points of inflection.

It is also common to add a small amount of Indium in the aluminum containing alloys to improve structural quality. An example of a structure utilizing Indium quaternary alloys in the structural layers has already been described in FIG. 6. Indium, typically at a concentration of about 1% to 2%, can also be added to some or all of the layers within the defect redirection region.

It should be appreciated that according to embodiments of the present disclosure, a modulated section of each period in the periodic mixed alloy may have a thickness of the order of one monolayer (such as is illustrated in FIGS. 11A-C, 12A-C, and 14A-C). Therefore, unlike traditional superlattices, there is no well-defined thickness in that section over which the composition is constant. Instead, the alloy composition varies to form a "mixed alloy" as indicated in the profiles in FIG. 11A-C, 12A-C, and 14A-C, and as evidenced in the x-ray spectrum of FIG. 13.

Furthermore, while the discussion above has been focused towards multiple quantum well active regions, it will be appreciated by one skilled in the art that other types of light-emitting active regions such as double heterojunction (DH), homojunction, quantum wire, active regions incorporating nanometer scale compositional inhomogeneities (NCI), and single quantum well active regions could also be employed. Moreover, while the discussion has been focused on light emitting diodes (LEDs), it will be appreciated by one skilled in the art that the structures and methods described also applies to other types of light emitting devices such as laser diodes and pump lasers.

Thus, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Rather, the foregoing detailed description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A semiconductor light emitting device, comprising:
an $Al_2O_3$ substrate;
a planar $In_kAl_xGa_{1-x-k}N$ template layer formed over said substrate, said template layer having threading dislocations originating at said substrate and propagating substantially in a direction perpendicular to the plane of said template layer;
a defect redirection region formed over said template layer, said template layer having threading dislocations transmitted from said template layer which are bent by said defect redirection region so as to propagate within said defect redirection region substantially in a direction other than perpendicular to the plane of said template layer;
an active region having a composition $In_zAl_yGa_{1-y-z}N$, formed over said defect redirection region said active region having threading dislocations transmitted from said defect redirection region, said threading dislocations propagating both in a direction perpendicular to the plane of said template layer and in a direction other than perpendicular to the plane of said template layer, the number of said threading dislocations propagating in a direction perpendicular to the plane of said template layer in said active region being substantially less than the number of threading dislocations propagating in a direction perpendicular to the plane of said template layer in said template layer; and
wherein said defect redirection region comprises a plurality of groups of layer pairs, a first of said layer pairs comprising $In_rAl_sGa_{1-s-r}N$, and a second of said layer pairs comprising $In_qAl_tGa_{1-t-q}N$, and wherein each group has an average aluminum concentration, the average aluminum concentration of the group proximate the template layer approaching or equal to x, and the average aluminum concentration of the group proximate the active region approaching or equal to y.

2. The semiconductor light emitting device of claim 1, wherein for each group the different layers comprising that group periodically repeat in order a plurality of times.

3. The semiconductor light emitting device of claim 2, wherein for each group the concentration of the first element in each of the at least one layers in that group is the same.

4. The semiconductor light emitting device of claim 2, wherein the average concentration of the first element varies periodically from group to group along a height of the defect redirection region.

5. A semiconductor light emitting device, comprising:
an $Al_2O_3$ substrate;
a planar $In_kAl_xGa_{1-x-k}N$ template layer formed over said substrate, said template layer having threading dislocations originating at said substrate and propagating substantially in a direction perpendicular to the plane of said template layer;
a defect redirection region formed over said template layer, said template layer having threading dislocations transmitted from said template layer which are bent by said defect redirection region so as to propagate in said defect redirection region substantially in a direction other than perpendicular to the plane of said template layer;
a structural region formed over said defect redirection region and comprising at least in part a first element;
an active region having a composition $In_zAl_yGa_{1-y-z}N$, formed over said structural region said active region having threading dislocations transmitted from said defect redirection region, said threading dislocations propagating both in a direction perpendicular to the plane of said template layer and in a direction other than perpendicular to the plane of said template layer, the number of said threading dislocations propagating in a direction perpendicular to the plane of said template layer in said active region being substantially less than the number of threading dislocations propagating in a direction perpendicular to the plane of said template layer in said template layer; and said defect redirection region further comprising a plurality of groups of layers, at least one layer within each said group comprised at least in part of the first element, an average concentration of the first element being higher in the group closest to the template layer relative to all groups in the defect redirection region, and the average concentration of the first element being lower in the group closest to the structural region relative to all groups in the defect redirection region.

6. The semiconductor light emitting device of claim 5, wherein the defect redirection region is comprised of a plurality of groups of layers, each group comprising at least one layer sub-group, a first layer of each layer sub-group comprised at least in part of the first element and a second layer of the layer sub-group not including the first element.

7. The semiconductor light emitting device of claim 6, wherein for each group the concentration of the first element is the same for all said first layers with said group.

8. The semiconductor light emitting device of claim 7, wherein each group has an average concentration of the first element, the average concentration of the first element being higher in the group closest to the template layer relative to all groups in the defect redirection region, and the average concentration of the first element being lower in the group closest to the active region relative to all groups in the defect redirection region.

9. The semiconductor light emitting device of claim 6, wherein the number of groups is two.

10. The semiconductor light emitting device of claim 9, wherein the number of layers in each sub-group is two.

11. The semiconductor light emitting device of claim 6, wherein the average concentration of the first element in the group closest to the template layer is in the range of 70-85%, and the average concentration of the first element in the group closest to the active region is in the range of 50-65%.

12. The semiconductor light emitting device of claim 5, wherein the first element is aluminum.

13. The semiconductor light emitting device of claim 5, wherein the average concentration of the first element varies periodically from group to group along the elevation of the defect redirection region.

14. The semiconductor light emitting device of claim 6, wherein the structural region is composed of AlN, the active region has an aluminum concentration between 30% and 40%, the average aluminum concentration in the group closest to the template layer is in the range of 70-85%, and the average aluminum concentration in the group closest to the active region is in the range of 50-65%.

15. The semiconductor light emitting device of claim 1, wherein said defect reduction region comprises a periodically varying mixed alloy comprising a plurality of modulated sections.

16. The semiconductor light emitting device of claim 15, wherein each modulated section in the periodic mixed alloy has a thickness of substantially one atomic monolayer.

17. The semiconductor light emitting device of claim 15, wherein the alloy composition of the modulated sections varies such that there is no well-defined thickness in any one of said modulated sections over which the alloy composition is constant.

18. A semiconductor light emitting device, comprising:
an $Al_2O_3$ substrate;
a planar $In_kAl_xGa_{1-x-k}N$ template layer formed over said substrate, said template layer having threading dislocations originating at said substrate and propagating substantially in a direction perpendicular to the plane of said template layer;
a defect redirection region formed over said template layer, said template layer having threading dislocations transmitted from said template layer which are bend by said defect redirection region so as to propagate within said defect reduction region substantially in a direction other than perpendicular to the plane of said template layer, said defect redirection region comprising:
at least two groups of layer pairs, each layer pair comprising a first layer of composition $In_zAl_xGa_{1-x-z}N$ where $0<x\leq1$, $0\leq z<1$ and a second of composition $In_pAl_yGa_{1-y-p}N$ where $0<y\leq1$, $0\leq p\leq1$ a first of said groups proximate said template layer having an average aluminum content equal to or approaching the aluminum content of said template layer; and
a second of said groups proximate said template layer having an average aluminum content equal to or approaching the aluminum content of said template layer; and
an active region having a composition $In_zAl_yGa_{1-y-z}N$, formed over said defect redirection region said template layer having threading dislocations transmitted from said defect redirection region, said threading dislocations propagating both in a direction perpendicular to the plane of said template layer and in a direction other than perpendicular to the plane of said template layer, the number of said threading dislocations propagating in a direction perpendicular to the plane of said template layer in said active region being substantially less than the number of threading dislocations propagating in a direction perpendicular to the plane of said template layer in said template layer.

19. The semiconductor light emitting device of claim 18, wherein the light emitting device produces light in the wavelength range of between 250 nm and 360 nm.

* * * * *